United States Patent
Takahashi et al.

(10) Patent No.: US 8,191,235 B2
(45) Date of Patent: Jun. 5, 2012

(54) METHOD OF PRODUCING MAGNETORESISTANCE EFFECT ELEMENT

(75) Inventors: Migaku Takahashi, Sendai (JP);
Masakiyo Tsunoda, Sendai (JP);
Koujiro Komagaki, Kawasaki (JO);
Yuji Uehara, Kawasaki (JP); Kazuyuki Sunaga, Kawasaki (JP)

(73) Assignees: Fujitsu Limited, Kawasaki (JP);
Tohoku University, Sendai (JP)

( * ) Notice: Subject to any disclaimer, the term of this patent is extended or adjusted under 35 U.S.C. 154(b) by 545 days.

(21) Appl. No.: 12/340,236

(22) Filed: Dec. 19, 2008

(65) Prior Publication Data

US 2009/0169915 A1 Jul. 2, 2009

(30) Foreign Application Priority Data

Dec. 28, 2007 (JP) ................................ 2007-340648

(51) Int. Cl.
*G11B 5/127* (2006.01)
*H04R 31/00* (2006.01)

(52) U.S. Cl. ............... 29/603.14; 29/603.12; 29/603.13; 29/603.15; 360/324.1; 360/324.11; 360/324.12; 360/324.2

(58) Field of Classification Search ............... 29/603.07, 29/603.13–603.16, 63.18; 216/62, 65, 66; 360/324.1, 324.11, 324.2, 324.12; 451/5, 451/41

See application file for complete search history.

(56) References Cited

U.S. PATENT DOCUMENTS 7,479,394 B2 *   1/2009   Horng et al. ................. 438/3
2007/0148786 A1   6/2007   Horng et al.

FOREIGN PATENT DOCUMENTS

| JP | 2007/073638 | 3/2007 |
| JP | A 2007-173843 | 7/2007 |
| WO | 2005/088745 | 9/2005 |

OTHER PUBLICATIONS

David D. Djayaprawira, et al., "230% room-temperature magnetoresistance in CoFeB/MgO/CoFeB magnetic tunnel junctions," Applied Physics Letters 86, 092502 (2005).
Stuart S. Parkin, et al., "Giant tunneling magnetoresistance at room temperature with MgO (100) tunnel barriers," Nature materials, Advanced online Publication, http://www.nature.com/naturematerials, doi:10.1038/nmat1256, Oct. 31, 2004.

(Continued)

*Primary Examiner* — Paul D Kim
(74) *Attorney, Agent, or Firm* — Greer, Burns & Crain, Ltd.

(57) ABSTRACT

The method of the present invention provides a magnetoresistance effect element, which is capable of having a high MR ratio, corresponding to high density recording and being suitably applied to a magnetoresistance device even though a barrier layer is thinned to reduce resistance of the magnetoresistance effect element. The method of producing the magnetoresistance effect element, which includes the barrier layer composed of an oxidized metal, a first magnetic layer contacting one of surfaces of the barrier layer and a second magnetic layer contacting the other surface thereof, comprises the steps of: laminating the barrier layer on the first magnetic layer with using a target composed of the oxidized metal; and laminating the second magnetic layer on the barrier layer. The barrier layer is annealed before laminating the second magnetic layer thereon.

2 Claims, 2 Drawing Sheets

OTHER PUBLICATIONS

Shinji Yuasa, et al., "Giant room-temperature magnetoresistance in single-crystal Fe/MgO/Fe magnetic tunnel junctions," Nature Materials, Advanced online Publication, http://www.nature.com/naturematerials, doi:10.1038/nmat1257, Oct. 31, 2004.

Notice of Rejection dated Nov. 29, 2011 for Japanese Application Serial No. 0753470 (English translation).

* cited by examiner

METHOD OF PRODUCING MAGNETORESISTANCE EFFECT ELEMENT

BACKGROUND OF THE INVENTION

The present invention relates to a method of producing a magnetoresistance effect film and a magnetoresistance effect film.

It is known that a magnetoresistance effect film having an insulating barrier layer composed of MgO has a great magnetoresistance (MR) ratio (see S. Yuasa et al., Nat. Mater. 3(2004)868; S. S. P. Parkin et al., Nat. Mater. 3(2004)862; and D. D. Djayaprawira et al., 230% room-temperature magnetoresistance in CoFeB/MgO/CoFeB mangentic tunnel junctions, Appl. Phys. Lett. 86(2005)092502). Because MgO has crystal orientation of (200), the MgO barrier layer has the great MR ratio.

TMR heads including the MgO barrier layers have high reproduction sensitivities, so they can be suitably used for magnetic heads and magnetic memory storages for high density recording. However, with increasing recording densities, magnetoresistance effect elements for reading signals must process signals at high speed. To increase signal transmitting speeds, resistance values of the magnetoresistance effect elements must be reduced. On the other hand, the magnetoresistance effect elements must be downsized so as to correspond to high recording densities. If the magnetoresistance effect elements are downsized without thinning barrier layers, resistance values of the barrier layers must be increased. Namely, the barrier layers must be thinned so as to downsize the magnetoresistance effect elements without at least varying the resistance values.

As described above, in the magnetoresistance effect elements having the barrier layers, the barrier layers must be thinner so as to downsize the magnetoresistance effect elements with maintaining the resistance values. However, if the barrier layers are thinned, crystal orientation of the barrier layers will be deteriorated and characteristics of the magnetoresistance effect elements, e.g., MR ratio, will be worsened.

Note that, a laminated structure, in which the barrier layer is sandwiched between a pinned magnetic layer, whose magnetization direction is fixed, and a free magnetic layer, whose magnetization direction is rotated by external magnetic fields, can be used for not only a part of the magnetoresistance effect element but also a part of a magnetoresistance device, e.g., M-RAM.

SUMMARY OF THE INVENTION

The present invention was conceived to solve the above described problems.

An object of the present invention is to provide a method of producing a magnetoresistance effect element, which is capable of having a high MR ratio, corresponding to high density recording and being suitably applied to a magnetoresistance device even though a barrier layer is thinned to reduce resistance of the magnetoresistance effect element.

Another object is to provide the magnetoresistance effect element.

Further object is to provide a modified magnetoresistance device.

To achieve the objects, the present invention has following constitutions.

Namely, the method of producing a magnetoresistance effect element, which includes a barrier layer composed of an oxidized metal, a first magnetic layer contacting one of surfaces of the barrier layer and a second magnetic layer contacting the other surface thereof, comprises the steps of: laminating the barrier layer on the first magnetic layer with using a target composed of the oxidized metal; and laminating the second magnetic layer on the barrier layer, and the barrier layer is annealed before laminating the second magnetic layer thereon.

Note that, the method of the present invention may be applied to magnetoresistance films for not only magnetic heads of magnetic memory storages but also magnetoresistance devices, e.g., M-RAM.

Preferably, the first magnetic layer is a pinned magnetic layer whose magnetization direction is fixed, and the second magnetic layer is a free magnetic layer whose magnetization direction is rotated by an external magnetic field. With this method, function of the external magnetic field can be detected as variation of a resistance value.

Preferably, the first magnetic layer is laminated on an antiferromagnetic layer so as to exchange-couple the first magnetic layer with the antiferromagnetic layer, whereby the first magnetic layer has unidirectional magnetization anisotropy. With this method, the magnetization direction of the first magnetic layer can be securely fixed, and function obtained by the magnetoresistance effect can be securely detected.

Preferably, the annealing treatment is performed in a vacuum atmosphere with heating the barrier layer at a temperature of 200-400° C. With this method, crystal orientation of the barrier layer can be improved, and the magnetoresistance effect of the magnetoresistance effect element can be improved.

Preferably, the barrier layer is a MgO layer, which is formed by sputtering with using the target composed of MgO. With this method, the crystal orientation of the barrier layer can be improved, and the suitable magnetoresistance effect of the magnetoresistance effect element can be obtained.

Next, the magnetoresistance effect element of the present invention comprises: an antiferromagnetic layer; a pinned magnetic layer being exchange-coupled with the antiferromagnetic layer so as to have unidirectional magnetization anisotropy; a free magnetic layer, whose magnetization direction is rotated by an external magnetic field; and a barrier layer being composed of MgO, the barrier layer being provided between the pinned magnetic layer and the free magnetic layer, a thickness of the barrier layer is 1.0 nm or less, and the barrier layer is annealed so as to have crystal orientation of (200).

Further, the magnetoresistance device of the present invention comprises: a barrier layer being composed of MgO; a magnetic layer contacting one of surfaces of the barrier layer; and a second magnetic layer contacting the other surface of the barrier layer, a thickness of the barrier layer is 1.0 nm or less, and the barrier layer is annealed so as to have crystal orientation of (200).

In the present invention, the crystal orientation of the barrier layer composed of the oxidized metal can be improved, so that characteristics of the magnetoresistance effect element can be improved. Since the barrier layer of the magnetoresistance effect element has specific crystal orientation, magnetic characteristics, e.g., MR ratio, of the magnetoresistance effect element can be improved.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1:
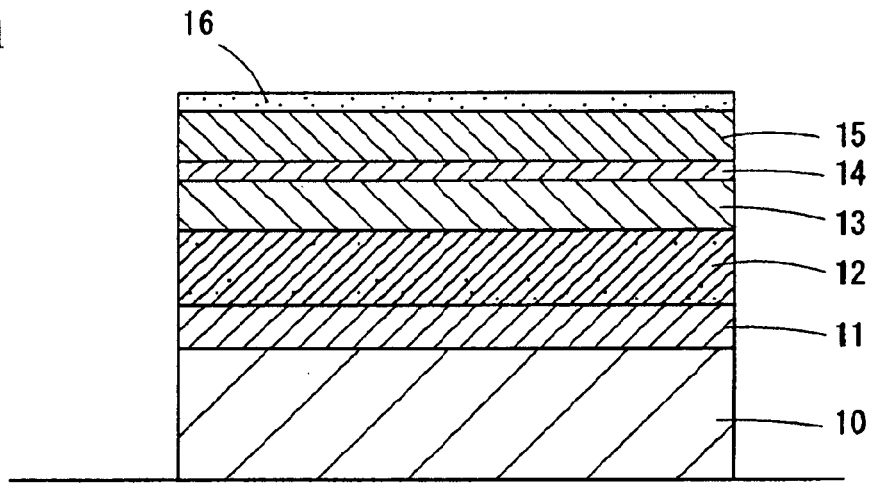
FIG. 1 is an explanation view of a step of producing a magnetoresistance effect element.
Figure 2:
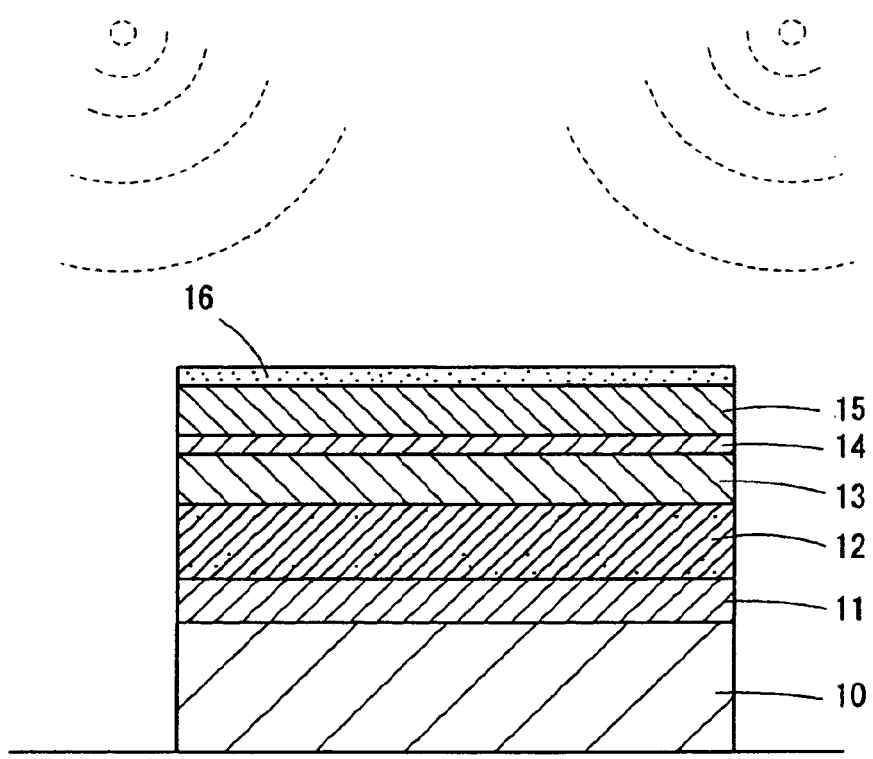
FIG. 2 is an explanation view of the next step of producing the magnetoresistance effect element.
Figure 3:
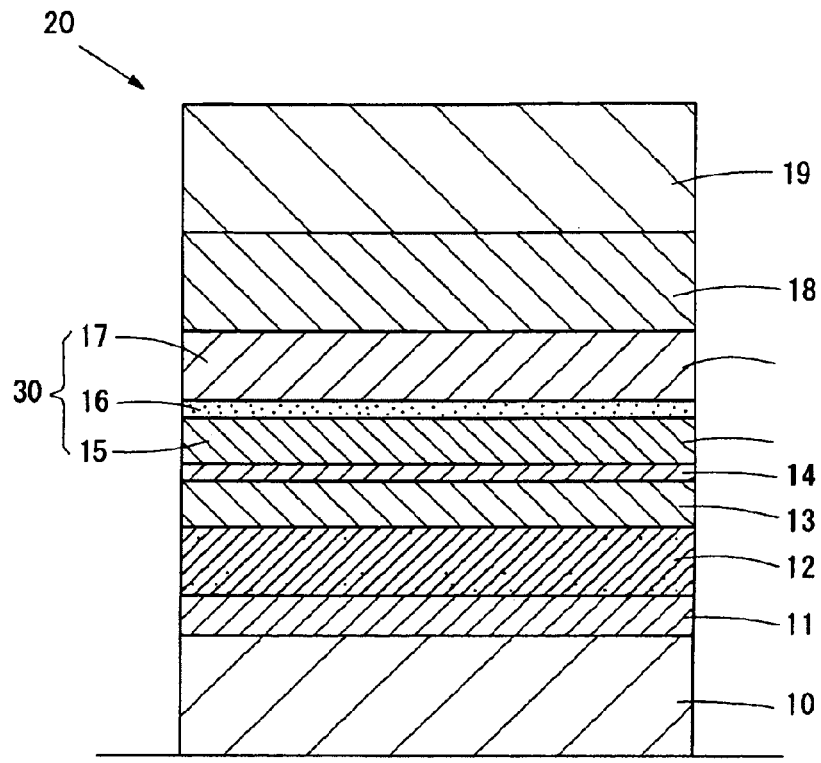
FIG. 3 is an explanation view of the further step of producing the magnetoresistance effect element.

FIGS. 1-3 show an embodiment of the method of producing a magnetoresistance effect element of the present invention. The magnetoresistance effect element can be used for a magnetic head.

In the magnetoresistance effect element, magnetic layers and nonmagnetic layers are laminated, and various types of laminated structures can be used. A tunnel magnetoresistance (TMR) element, which is an example of the magnetoresistance effect elements, is shown in FIGS. 1-3.

The TMR element of the present embodiment includes: a lower shielding layer 10; an antiferromagnetic base layer 11; an antiferromagnetic layer 12; a first pinned magnetic layer 13; an antiferromagnetic coupling layer 14; a second pinned magnetic layer 15; a barrier layer 16; a free magnetic layer; a cap layer 18; and an upper shielding layer 19.

In FIG. 1, the lower shielding layer 10, the antiferromagnetic base layer 11, the antiferromagnetic layer 12, the first pinned magnetic layer 13, the antiferromagnetic coupling layer 14, the second pinned magnetic layer 15 and the barrier layer 16 are laminated on a surface of a wafer in this order.

The lower shielding layer 10 has magnetic shielding function and acts as one of electrodes for passing a sensing current. The lower shielding layer 10 is composed of a soft magnetic material, e.g., NiFe. In the present embodiment, the lower shielding layer 10 is formed by sputtering.

The antiferromagnetic base layer 11 is formed as a base layer of the antiferromagnetic layer 12 and constituted by Ta (tantalum) and Ru (ruthenium). A thickness of the antiferromagnetic base layer 11 is about 3 nm.

The antiferromagnetic layer 12 is exchange-coupled with the first pinned magnetic layer 13 laminated thereon, by exchange-coupling function, so as to fix or pin a magnetization direction of the first pinned magnetic layer 13. The antiferromagnetic layer 12 is composed of an antiferromagnetic material, e.g., Mn, Ir, PtMn, PdPtMn, and formed by sputtering. A thickness of the antiferromagnetic layer 12 is about 1 nm.

The first pinned magnetic layer 13 is a magnetic layer, whose magnetization direction is not rotated by external magnetic fields. The first pinned magnetic layer 13 is composed of a ferromagnetic material, e.g., CoFe, and formed by sputtering. A thickness of the first pinned magnetic layer 13 is about 3 nm.

The antiferromagnetic coupling layer 14 antiferromagnetically couples the first pinned magnetic layer 13 with the second pinned magnetic layer 15, and the antiferromagnetic coupling layer 14 is composed of a nonmagnetic material, e.g., Ru (ruthenium). A thickness of the antiferromagnetic coupling layer 14 is about 1 nm. The antiferromagnetic coupling layer 14 is formed by sputtering. By antiferromagnetically coupling the first pinned magnetic layer 13 with the second pinned magnetic layer 15 by the antiferromagnetic coupling layer 14, a magnetization direction of the entire pinned magnetic layer can be securely fixed or pinned. For example, the second pinned magnetic layer 15 is composed of CoFeB and has a thickness of about 3 nm.

The entire pinned magnetic layer may be constituted by three of more pinned magnetic layers. In this case too, antiferromagnetic coupling layers are formed between the pinned magnetic layers. On the other hand, a single-layer pinned magnetic layer may be employed without forming the antiferromagnetic coupling layer 14.

The barrier layer 16 is composed of an oxidized metal, which is an electrically insulating material. In the present embodiment, MgO is used as the insulating material of the barrier layer 16, and the barrier layer 16 is formed on a surface of the second pinned magnetic layer 15 by RF-sputtering with using a MgO target. A thickness of the barrier layer 16 is about 1 nm.

The barrier layer 16 may be composed of other insulating materials other than MgO.

The layers from the lower shielding layer 10 to the barrier layer 16 are shown in FIG. 1.

In the process of forming from the lower shielding layer 10 to the barrier layer 16, the wafer is transferred to process stages, which respectively correspond to the layers to be formed thereon. In each of the stages, each of the layers is formed by sputtering at room temperature.

In the conventional method, a magnetoresistance effect element is produced by the steps of: forming the barrier layer 16, and then forming the free magnetic layer 17, the cap layer 18 and the upper shielding layer 19 on the barrier layer 16 in this order.

The production method of the present embodiment is characterized by the steps of: forming the barrier layer 16; annealing the barrier layer 16; and forming the free magnetic layer 17, etc. on the annealed barrier layer 16.

After forming the barrier layer 16, the wafer is heated (annealed), in a vacuum atmosphere, from the room temperature to about 200-400° C., and then the wafer is cooled until reaching the room temperature so as to perform the following film forming process.

In FIG. 2, the wafer, on which the barrier layer 16 has been formed, is heated (annealed). For example, the wafer is heated at 350° C. for about 10 minutes, and then cooled until reaching the room temperature.

The above described heat treatment (annealing treatment) is capable of improving crystal orientation of the barrier layer 16 and improving magnetic characteristics of the magnetoresistance effect element, e.g., MR ratio. Characteristic differences between the magnetoresistance effect element, which has been heat-treated (annealed) after forming the barrier layer 16, and a magnetoresistance effect element, which has not been heat-treated, will be explained later.

The free magnetic layer 17 is formed on the barrier layer 16, which has been annealed. The free magnetic layer 17 is a magnetic layer whose magnetization direction is rotated by external magnetic fields. For example, the free magnetic layer 17, which is composed of CoFe or CoFeB, is formed by sputtering and has a thickness of about 3 nm.

Next, the cap layer 18 is formed. The cap layer 18 mainly acts as a protection layer. The cap layer 18, whose thickness is about 5 nm, is composed of Ta (tantalum) or Ru (ruthenium) and is formed by sputtering.

The upper shielding layer 19 is composed of a soft magnetic material, e.g., NiFe, as well as the lower shielding layer 10. The upper shielding layer 19 has magnetic shielding function and acts as the other electrode for passing the sensing current as well as the lower shielding layer 10.

The magnetoresistance effect element 20 of the present embodiment has a film structure of the TMR-type magnetoresistance effect element. The sensing current passes between the lower shielding layer 10 and the upper shielding layer 19, which act as the electrodes, so as to detect magnetic data on the basis of variation of the resistance value, which is varied by external magnetic fields.

Figure 4:
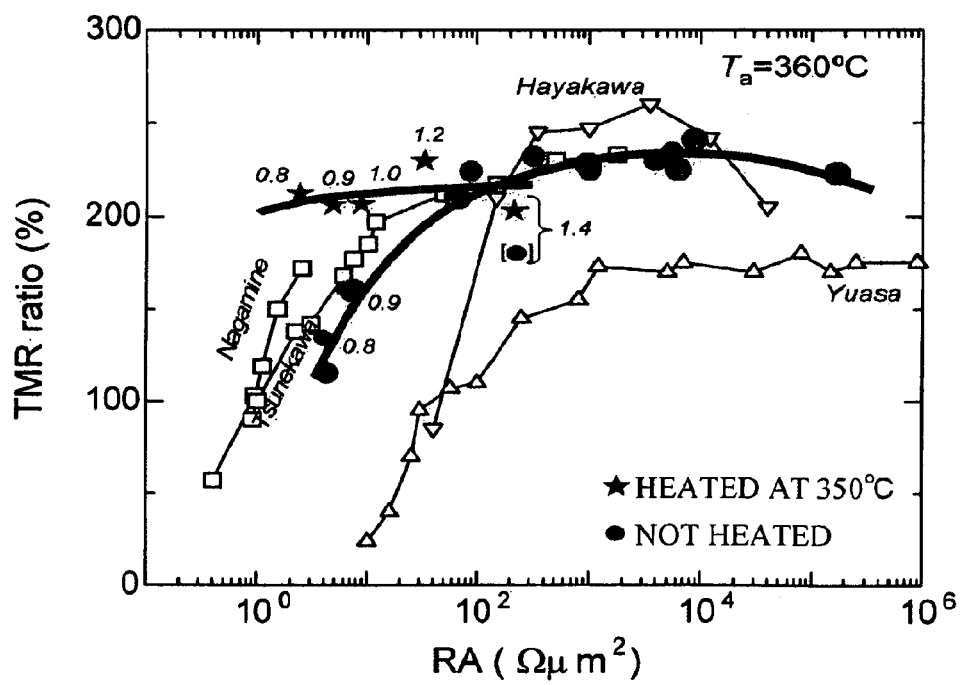
FIG. 4 is a graph of measured MR ratio with respect to areal resistance of the magnetoresistance effect element.

FIG. 4 is a graph showing variation of MR ratios of TMR-type magnetoresistance effect elements, in each of which the MgO barrier layer is formed and annealed, and those of TMR-type magnetoresistance effect elements, in each of which a MgO barrier layer is not annealed.

In FIG. 4, the horizontal axis indicates areal resistance; the vertical axis indicates MR ratio. Further, variation of MR ratios of conventional magnetoresistance effect elements having MgO barrier layers are also shown in FIG. 4. The conventional magnetoresistance effect elements are named as Yuasa, Hayakawa, Nagamine and Tsunekawa. According to the data, areal resistances (RA) of the conventional elements are small. Namely, the MR ratios are drastically reduced with reducing thicknesses of the MgO barrier layers.

In FIG. 4, data indicated by black circles and star marks were measured by the inventors. The data indicated by the black circles relate to samples of the TMR-type magnetoresistance effect element, in each of which the Mgo barrier layer was formed and transferred to following process at room temperature. On the other hand, the data indicated by the star marks relate to samples of the TMR-type magnetoresistance effect element, in each of which the Mgo barrier layer was formed and heated (annealed) at 350° C. for 10 minutes, and then transferred to following process. Note that, numbers attached to the black circles and the star marks indicate thicknesses of the MgO barrier layers of the samples. For example, the numbers "0.8" and "0.9" mean that the thicknesses of the MgO barrier layers are 0.8 nm and 0.9 nm.

According to the measured data shown in FIG. 4, in case that the MgO barrier layers of the samples were not heated (annealed), the MR ratio was drastically reduced with reducing the thickness of the MgO barrier layer, as well as the conventional magnetoresistance effect elements.

On the other hand, in case that the MgO layers of the samples were heated (annealed), the MR ratio was seldom reduced with reducing the thickness of the MgO layer, in comparison with that of the sample having the thick MgO layer.

For example, in case that the MgO layers were not heated, the MR ratio was drastically reduced with reducing the thicknesses thereof from 1.4 nm to 0.9 nm and 0.8 nm. On the other hand, in case that the MgO layers were heated (annealed), the MR ratio was substantially constant even if the thicknesses thereof were reduced from 1.4 nm to 1.2 nm, 1.0 nm, 0.9 nm and 0.8 nm.

According to the results, we suppose that crystal orientation of (200) in the MgO layer can be maintained by the above described annealing treatment, so that the good MR ratio can be obtained. In the production method of the present embodiment, the sufficient MR ratio can be obtained even if the barrier layer 16 is thinned. Therefore, even in a small magnetoresistance effect element for a magnetic head capable of corresponding to high density recording, the resistance of the magnetoresistance effect element can be reduced and superior magnetoresistance characteristics can be obtained.

In the above described embodiment, the magnetoresistance effect element has the barrier layer composed of MgO, but the present invention is not limited to the above described embodiment. The barrier layer 16 may be composed other electrically insulating oxidized metals other than MgO.

In the magnetoresistance effect element 20 shown in FIG. 3, the second pinned magnetic layer 15 corresponds to the first magnetic layer of the present invention, and the free magnetic layer 17 corresponds to the second magnetic layer thereof. A laminated structure 30 constituted by the second pinned magnetic layer 15, the barrier layer 16 and the free magnetic layer 17 can be used as a basic part of a magnetoresistance device, e.g., M-RAM. For example, in a M-RAM, the magnetization direction of the free magnetic layer is rotated by external magnetic fields, so data can be read and written by detecting variation of resistance between electrodes. Therefore, the laminated structure constituted by the first magnetic layer, the barrier layer and the second magnetic layer can be used for producing magnetoresistance devices, e.g., M-RAM, as well.

When the magnetoresistance device is downsized, a thickness of the barrier layer should be thinned without worsening magnetic characteristics, as well as the magnetoresistance effect element of the magnetic head. The production method of the magnetoresistance effect element of the present invention can be applied to magnetoresistance devices. Therefore, magnetoresistance devices having superior magnetic characteristics can be produced.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of producing a magnetoresistance effect element, which includes a barrier layer composed of an oxidized metal, a first magnetic layer, which is constituted of a pinned layer whose magnetization direction is fixed and which contacts a surface of the barrier layer, and a second magnetic layer, which is constituted by a free layer whose magnetization direction is turned by an external magnetic field and which contacts another surface of the barrier layer, comprising the steps of:

laminating the barrier layer, which is constituted of a MgO layer whose thickness is 1.0 nm or less, on the first magnetic layer by a sputtering method in which a target composed of MgO is used; and laminating the second magnetic layer on the barrier layer, wherein the barrier layer is annealed, by heating the barrier layer at a temperature of between 200-400° C. in a vacuum atmosphere, before laminating the second magnetic layer on the barrier layer, so as to maintain crystal orientation of (200).

2. The method according to claim 1, wherein the first magnetic layer is laminated on an antiferromagnetic layer so as to exchange-couple the first magnetic layer with the antiferromagnetic layer, whereby the first magnetic layer has unidirectional magnetization anisotropy.

* * * * *